United States Patent
Choi et al.

(10) Patent No.: US 7,518,870 B2
(45) Date of Patent: Apr. 14, 2009

(54) CARD SLOT APPARATUS HAVING A MOVABLE HEAT RADIATING UNIT AND ELECTRONIC MACHINE HAVING THE SAME

(75) Inventors: Young-ho Choi, Suwon-si (KR); Hiroshi Narita, Yokohama (JP)

(73) Assignees: Samsung Electronics Co., Ltd., Suwon-si, Gyeonggi-do (KR); Otax Company Limited, Nippa-cho Kohhoku-ku, Yokohama (JP)

( * ) Notice: Subject to any disclaimer, the term of this patent is extended or adjusted under 35 U.S.C. 154(b) by 0 days.

(21) Appl. No.: 11/727,883

(22) Filed: Mar. 28, 2007

(65) Prior Publication Data

US 2007/0274046 A1    Nov. 29, 2007

(30) Foreign Application Priority Data

May 29, 2006    (KR) ............... 10-2006-0048308

(51) Int. Cl.
    *H05K 7/20*    (2006.01)
(52) U.S. Cl. ............... 361/702; 439/159; 361/711
(58) Field of Classification Search ........... 439/159; 361/702, 715, 709, 717, 719, 711
    See application file for complete search history.

(56) References Cited

U.S. PATENT DOCUMENTS

| 6,942,506 B2* | 9/2005 | Kimura et al. ............... 439/159 |
| 6,992,889 B1* | 1/2006 | Kashiwagi et al. ........... 361/700 |
| 7,090,519 B2* | 8/2006 | Muramatsu et al. .......... 439/159 |
| 7,133,285 B2* | 11/2006 | Nishimura .................. 361/715 |
| 7,327,577 B2* | 2/2008 | Gilliland et al. ............ 361/719 |
| 2004/0226689 A1* | 11/2004 | Thompson et al. .......... 165/80.2 |

FOREIGN PATENT DOCUMENTS

JP    2005-222537    8/2005

* cited by examiner

*Primary Examiner*—Michael C Zarroli
(74) *Attorney, Agent, or Firm*—Roylance, Abrams, Berdo & Goodman, L.L.P.

(57) ABSTRACT

A card slot apparatus of a card and an electronic machine includes a slot body having a slot in which a card is inserted, and a heat radiating unit movable between a first position spaced apart from the card and a second position contacting the card. A moving unit moves the heat radiating unit to the second position while moving in an opposite direction to an inserting direction of the card in combination with an inserting operation of the card into the slot body. An elastic unit elastically urges the moving unit in a moving direction thereof. The heat radiating unit includes a heat sink, and an elastic member to press the heat sink when the heat sink is moved to the second position. The elastic unit elastically urges the moving unit in the moving direction thereof when the heat sink is moved to the second position.

36 Claims, 7 Drawing Sheets

US 7,518,870 B2

CARD SLOT APPARATUS HAVING A MOVABLE HEAT RADIATING UNIT AND ELECTRONIC MACHINE HAVING THE SAME

CROSS-REFERENCE TO RELATED APPLICATIONS

This application claims the benefit under 35 U.S.C. § 119 (a) from Korean Patent Application No. 10-2006-0048308, filed on May 29, 2006, in the Korean Intellectual Property Office, the entire content of which is hereby incorporated by reference.

BACKGROUND OF THE INVENTION

1. Field of the Invention

The present invention relates to an electronic machine having a slot for mounting a dismountable card therein. More particularly, the present invention relates to a card slot apparatus having an improved structure for easy mounting of the card, and an electronic machine having the same.

2. Description of the Related Art

An integrated circuit (IC) card (referred to as a card below), such as a personal computer memory card international association (PCMCIA) card, is mountable in a card slot apparatus in an electronic machine, such as a lap top computer or a slim digital television, for use therein. When the card is inserted in the card slot apparatus, it is electrically connected to the electronic machine to carry out a desired operation.

Recently, such cards are tending toward increased high level functionality and integration of circuit chips in a large scale. Accordingly, during operation, the card radiates a large amount of heat. Because the heat radiated during the operation of the card may increase temperature in the card, which can result in abnormal operation of the card, it is necessary for the card slot apparatus to be equipped with a heat radiating unit.

An example of a card slot apparatus having a heat radiating unit is disclosed in a Japanese patent publication No. H10-198462. FIG. 1 is a view schematically illustrating the card slot apparatus disclosed in the Japanese patent publication No. H10-198462.

As illustrated in the drawing, the card slot apparatus has a heat radiating unit 20 installed in a slot. When a card C is inserted in the slot, the heat radiating unit 20 comes in contact with the card C and radiates heat generating from the card C.

However, according to the card slot apparatus as described above, when the card is inserted in the slot, the heat radiating unit 20 and the card C come in contact with each other. Accordingly, a problem may occur in that it is difficult to insert and eject the card into and from the slot, and a surface of the card can be scratched.

To address the problem, a structure that shelters a heat radiating unit (that is, a heat sink) in an upper part of a slot before the card is inserted has been proposed and disclosed in a Japanese patent publication No. 2005-222537. When the card is inserted in the slot, the heat radiating unit gradually goes down by a cam unit and comes in contact with the card.

The card slot apparatus (Japanese patent publication No. 2005-222537) as described above presents a problem in that at an early stage of inserting the card, the card and the heat radiating unit do not contact each other, thereby allowing the card to be easily inserted. However, from a certain point of time, the card and heat radiating unit contact each other, thereby resulting in an increase in insertion resistance of the card. Even though the card is not completely connected with an electronic machine, some users may determine that the card is completely inserted and quit the inserting operation of the card, due to the increased insertion resistance of the card. As a result, a connection error of the card may occur.

Also, a technique that lowers a heat radiating unit using a cam unit like the Japanese patent publication No. 2005-222537 has been proposed and disclosed in a Japanese patent publication No. 2005-285522. In the Japanese patent publication No. 2005-285522, a structure that automatically lowers the heat radiating unit after a card is completely inserted is employed. According to the structure, because the heat radiating unit and the card do not contact each other while the card is inserted, there is almost no insertion resistance of the card. However, a unit is required to independently lower the heat radiating unit after the card is completely inserted. Accordingly, a problem may occur in that such structure is complicated or the number of parts is increased, thereby increasing mechanical troubles and fabrication costs.

Accordingly, a need exists for a card slot apparatus having an improved heat radiating unit that is movable in response to insertion and removal of a card.

SUMMARY OF THE INVENTION

Accordingly, an aspect of the present invention is to provide a card slot apparatus having a simplified structure capable of reducing resistance in inserting and ejecting operations of a card and an electronic machine having the same.

According to one aspect of an exemplary embodiment of the present invention, a card slot apparatus includes a slot body having a slot in which a card is inserted, and a heat radiating unit movable between a first position spaced apart from the card, and a second position contacting the card. A moving unit moves the heat radiating unit to the second position while moving in an opposite direction to an inserting direction of the card in combination with an inserting operation of the card into the slot body. An elastic unit elastically urges the moving unit in a moving direction thereof.

The heat radiating unit may include a heat sink, and an elastic member to press the heat sink when the heat sink is moved to the second position. The elastic unit may elastically urge the moving unit in the moving direction thereof when the heat sink is moved to the second position.

The moving unit may include a link member to rotate forward and backward and contacting a preceding end of the card inserted in the slot body. A lever member is coupled to the link member to linearly move according to a rotation of the link member, and has a first cam and a second cam. A first guide is coupled to the heat radiating unit through the first cam. A second guide is coupled to the elastic unit through the second cam.

The first guide may be coupled to the elastic member of the heat radiating unit.

The elastic member may include a leaf spring, an approximate center of which is coupled and installed to the heat sink.

The first cam may be formed in the shape of a closed curve, and include a flat surface, a gentle slope surface and a steep slope surface. The second cam may be formed in the shape of an opened curve, and include a flat surface and a steep slope surface.

The lever member may include a first lever coupled to the link member, and a second lever coupled to the first lever. The first and second cams may be formed on the second lever.

The lever member may further include first and second guide slits formed respectively in the first and the second levers to correspond to each other, and a slider inserted in the first and the second guide slits to movably couple the first and the second levers with each other.

The first lever may have a hanging protrusion, which is engaged with a jaw portion of the second lever.

The second lever may have an operating part to eject the card.

The elastic unit may include a moving member to which the second guide is coupled, a fixing member fixed to the slot body, and a guide bar for guiding movement of the moving member. A tension coil spring is disposed between the moving member and the fixing member.

The second guide may be rollably coupled to moving member.

According to another aspect of an exemplary embodiment of the present invention, an electronic machine includes a main body, and a card slot apparatus disposed in the main body for mounting a dismountable card. The card slot apparatus include a slot body having a slot in which the card is inserted, and a heat radiating unit movable between a first position spaced apart from the card and a second position contacting the card. A moving unit moves the heat radiating unit to the second position while moving in an opposite direction to an inserting direction of the card in combination with an inserting operation of the card into the slot body. An elastic unit elastically urges the moving unit in a moving direction thereof.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

These and/or other aspects and advantages of certain embodiments of the present invention will become apparent and more readily appreciated from the following description of the exemplary embodiments, taken in conjunction with the accompanying drawings, of which.

Throughout the drawings, the same drawing reference numerals will be understood to refer to the same elements, features, and structures.

DETAILED DESCRIPTION OF EXEMPLARY EMBODIMENTS

The matters defined in the description, such as a detailed construction and elements thereof, are provided to assist in a comprehensive understanding of the embodiments of the present invention and are merely exemplary. Accordingly, those of ordinary skill in the art will recognize that various changes and modifications of exemplary embodiments described herein may be made without departing from the scope and spirit of the invention. Additionally, descriptions of well-known functions and constructions are omitted for clarity and conciseness.

Figure 1:
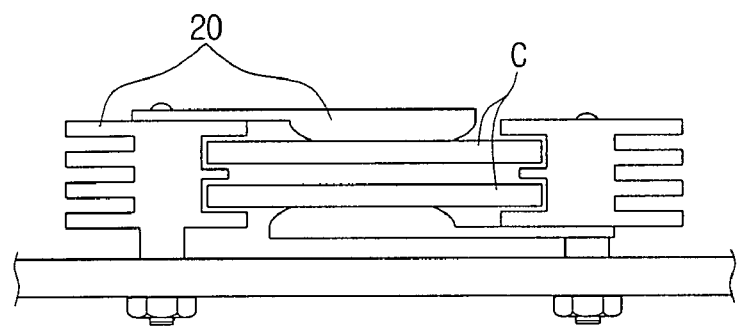
FIG. 1 is a schematic view of a conventional card slot apparatus having a heat radiating unit.
Figure 2:
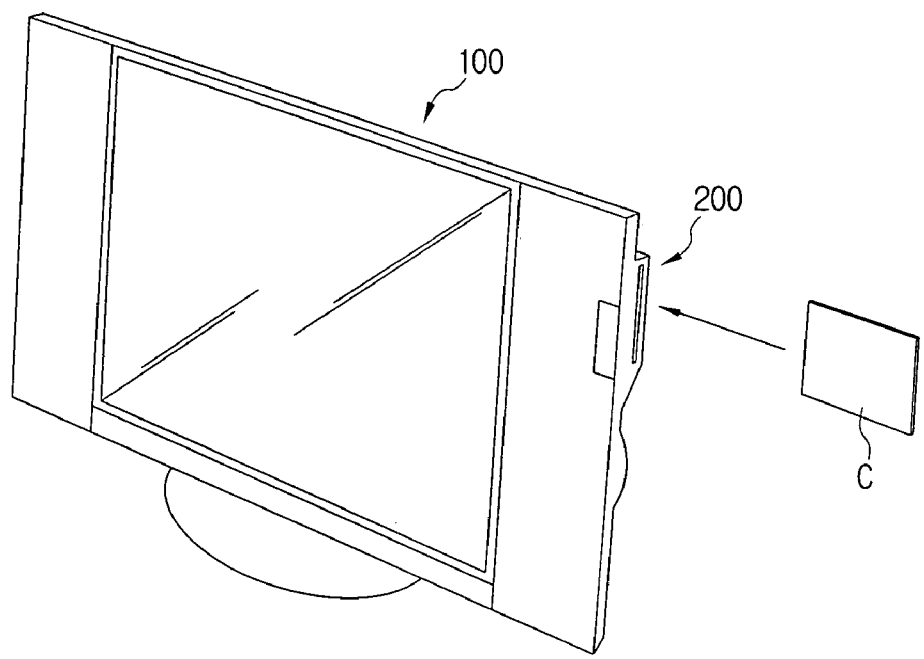
FIG. 2 is a perspective view of a slim type digital television having a card slot apparatus according to an exemplary embodiment of the present invention.

FIG. 2 is a perspective view of a slim type digital television as an example of an electronic machine having a card slot apparatus according to an exemplary embodiment of the present invention. As illustrated in the drawing, a card slot apparatus 200 is disposed in a side of the electronic machine 100. When a card C is inserted in the card slot apparatus 200, it is electrically connected to the electronic machine 100 to carry out a desired operation. In an exemplary embodiment of the present invention, the slim type digital television is illustrated and explained as an example of an electronic machine 100 to which the card slot apparatus according to an exemplary embodiment of the present invention is applied, but the present invention is not so limited. For example, the card slot apparatus 200 according to an exemplary embodiment of the present invention is applicable to all the electronic machines having a slot for mounting a dismountable card therein.

As illustrated in FIGS. 3 through 7, the card slot apparatus 200 according to an exemplary embodiment of the present invention includes a slot body 210, a heat radiating unit 220, a moving unit 230, and an elastic unit 240.

Figure 3:
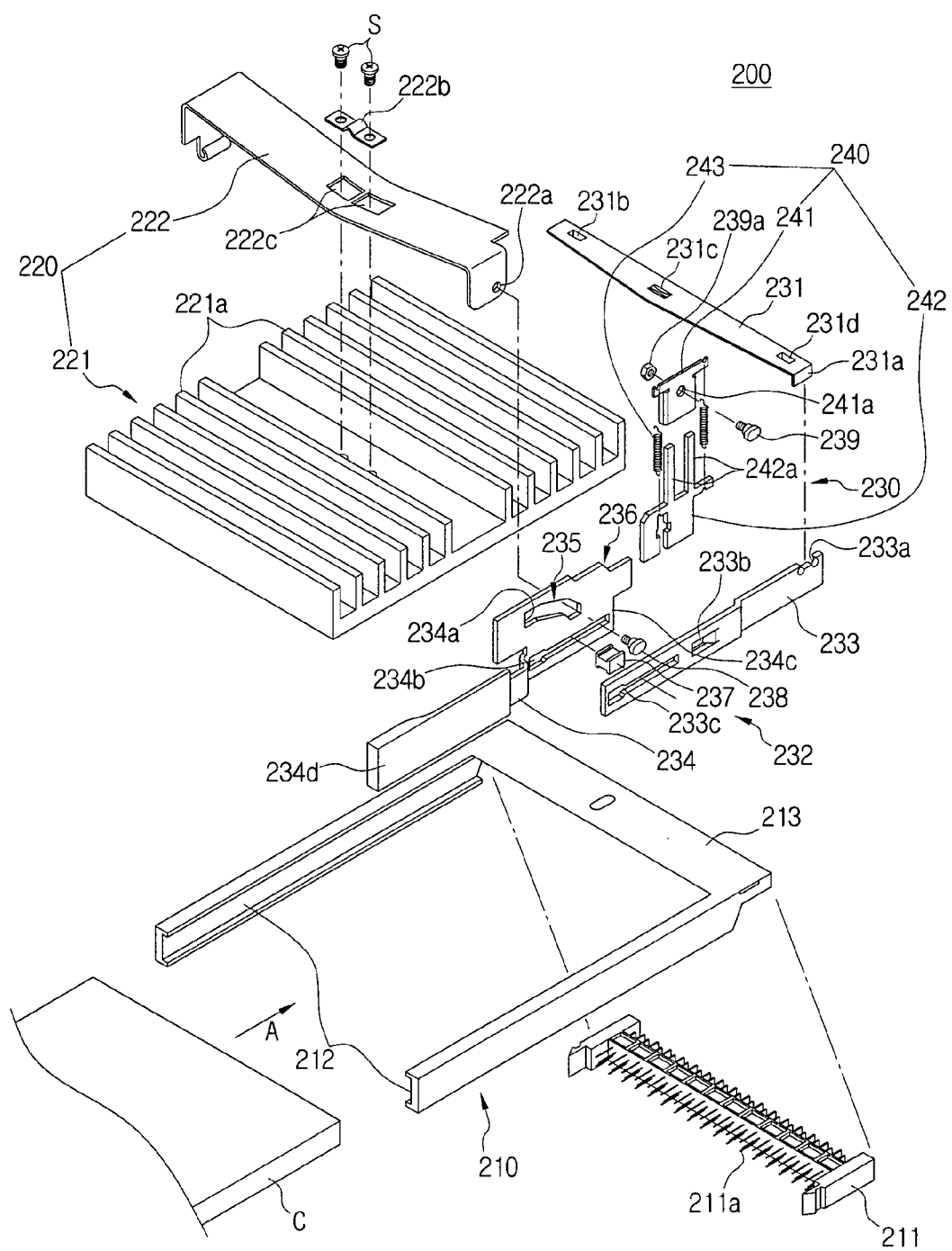
FIG. 3 is an exploded perspective view of a card slot apparatus according to an exemplary embodiment of the present invention.
Figure 4:
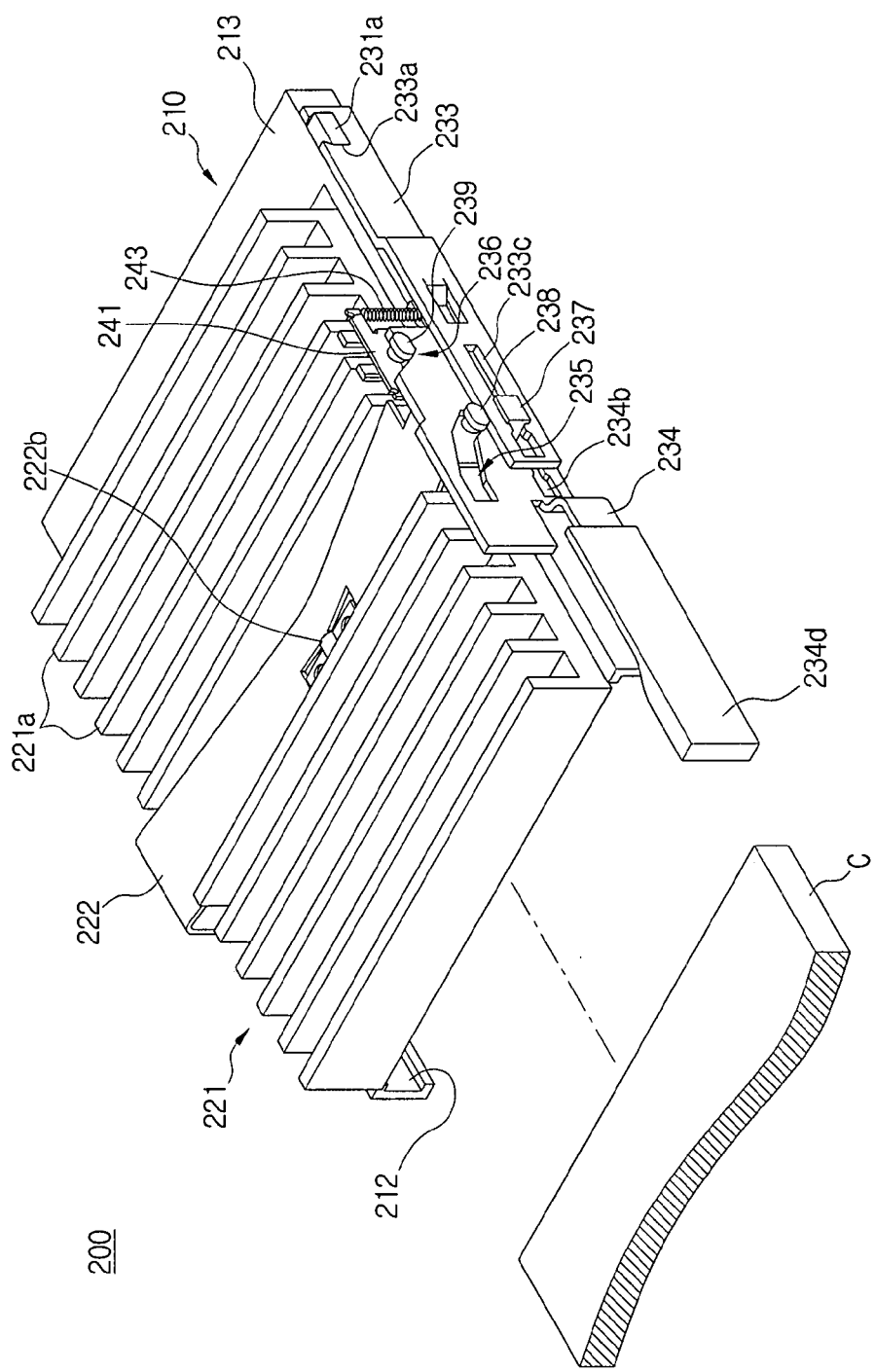
FIG. 4 is an assembled perspective view of the card slot apparatus of FIG. 3.

The slot body 210 is provided with a housing 211, a guide rail 212, and an upper cover 213. As illustrated in FIG. 3, the housing 211 supports a plurality of connecting pins 211a that are electrically connected with the card C, which is inserted in a direction indicated by arrow A. The connecting pins 211a are connected with a preceding end of the card C when it is completely inserted in the slot body 210, thereby electrically connecting the card C and the electronic machine 100.

The guide rail 212 is extended along an inserting direction (that is, the direction indicated by arrow A) of the card C. The guide rail 212 guides the card C when it is inserted and ejected, and, at the same time, restrains the inserted card C from freely moving. The guide rail 212 is configured so that a pair of guide rails face each other and are disposed to support opposite sides of the card C.

The upper cover 213 is disposed between the pair of guide rails 212 to cover an upper part of the housing 211. Accordingly, the connecting pins 211 a of the housing 211 are not exposed outside of the electronic machine.

The heat radiating unit 220, which radiates heat generated when the card C is operated after being inserted in the slot body 210 and connected with the connecting pins 211a, includes a heat sink 221 having a plurality of heat radiating pins 221a at a top thereof. Preferably, but not necessarily, a thermal pad (not illustrated) is installed on an undersurface of the heat sink 221 to improve the heat radiating efficiency of the heat radiating unit 220.

The heat radiating unit 220 is movable between a first position spaced apart from the card C and a second position contacting the card C. The heat radiating unit 220 has an elastic member 222 to press the heat sink 221 when the heat radiating unit 220 is moved to the second position.

Figure 5:
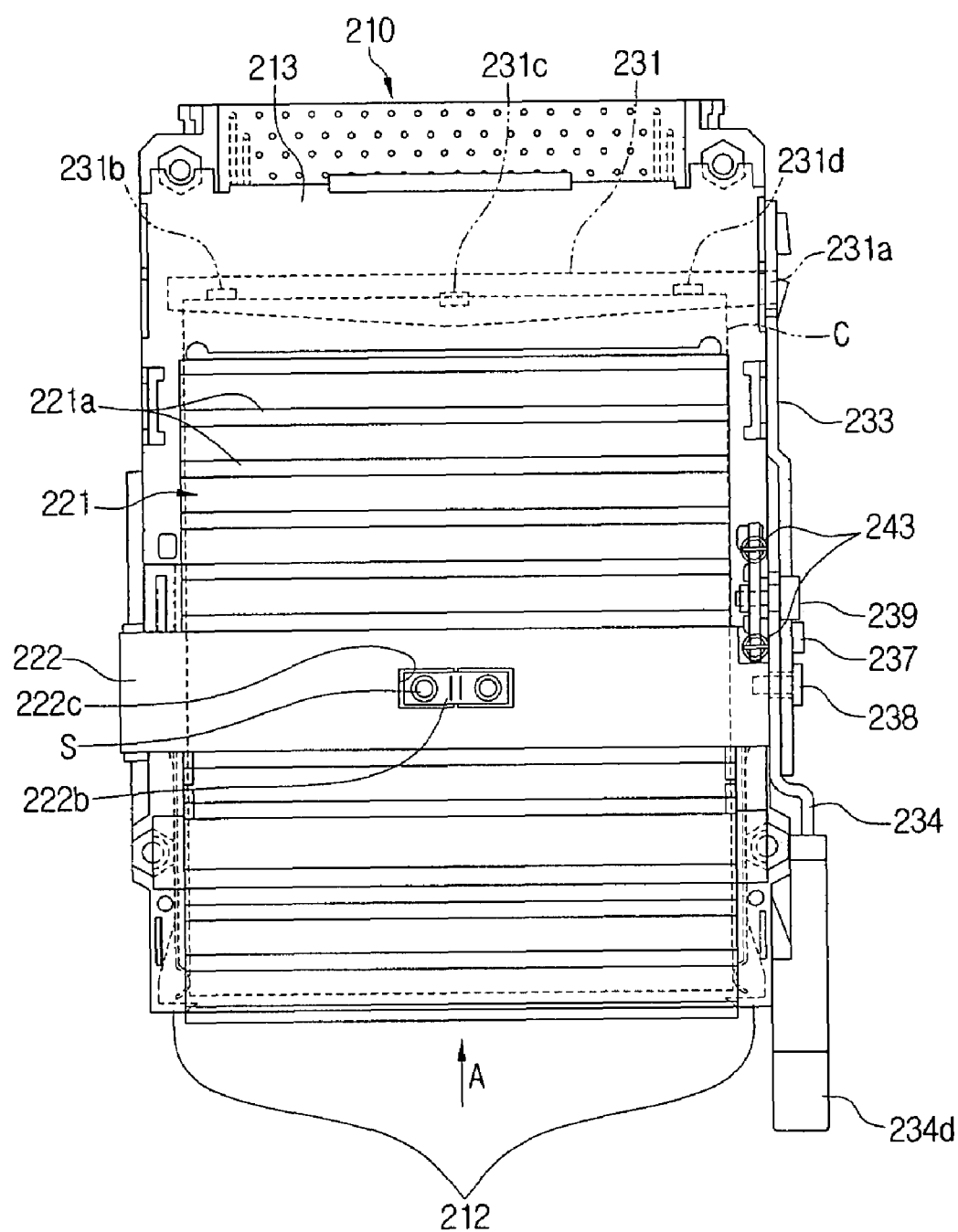
FIG. 5 is a top plan view of the card slot apparatus of FIG. 4.
Figure 7:
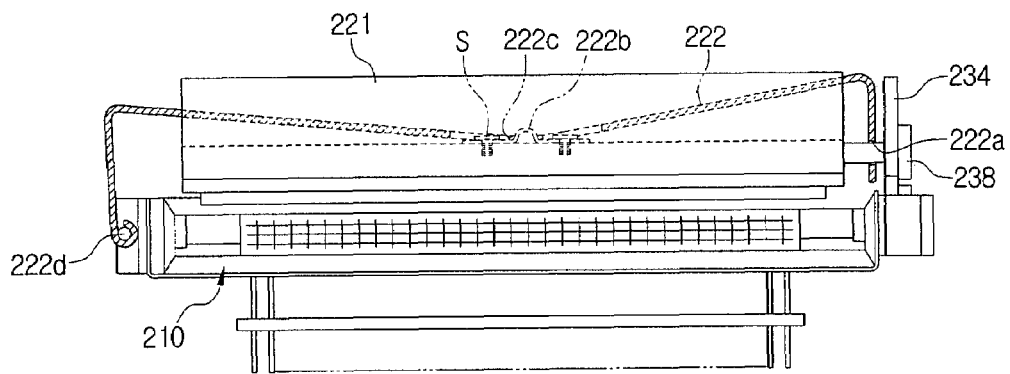
FIG. 7 is a front elevational view of the card slot apparatus of FIG. 4.

When the heat sink 221 is moved to the second position, the elastic member 222 presses the heat sink 221 toward the card C, so that the heat sink 221 contacts the card C. As illustrated in FIGS. 5 and 7, the elastic member 222 is made up of a leaf spring, which is coupled and installed to an approximate center of the heat sink 331 by screws S, or any other suitable fastener.

To fix the elastic member 222 to the heat sink 221, the elastic member 222 includes holes 222c and a fixing bracket 222b. Both ends of the fixing bracket 222b are inserted in the holes 222c in the elastic member 222. Accordingly, the elastic member 222 is movable about the fixing bracket 222b fixed to the heat sink 221 by the screws S.

At one end of the elastic member 222 is formed a first fixing hole 222a, which is coupled with the moving unit 230 to be described later. As illustrated in FIG. 7, at the other end of the elastic member 222 is rotatably installed an axle 222d, which is formed outside the guide rail 212. Accordingly, the elastic member 222, which supports the approximate center of the heat sink 221, may be smoothly moved and positioned by the moving unit 230.

With the construction as described above, the heat sink 221 is moved and positioned while being supported by the elastic member 222.

The moving unit 230 moves the heat radiating unit 220 to the second position while moving in an opposite direction (a direction indicated by arrow B in FIGS. 8B and 9C) to the inserting direction A of the card C in combination with the inserting operation of the card C into the slot body 210. Such a moving unit 230 includes a link member 231, a lever member 232, a first guide 238, and a second guide 239.

The link member 231 rotates forward and backward and contacts a preceding end of the card C inserted into the slot body 210. The link member 231 has a hook 231a extending from a tip of one end thereof to connect with the lever member 232. First and second contact protrusions 231b and 231d are formed proximal both ends of the link member to contact the preceding end of the card C. A rotation axle 231c is disposed proximal the center of the link member 231 and is connected to the upper cover 213 to support the link member 231 when it is rotated forward and backward.

The first and the second contact protrusions 231b and 231d extend downwardly from the link member 231 with the rotation axle 231c disposed therebetween, so that the contact protrusions 231b and 231d contact the preceding end of the card C. The first and the second contact protrusions 231b and 231d are formed such that they do not interfere with the connection of the card C to the connecting pins 211a.

Figure 9A:
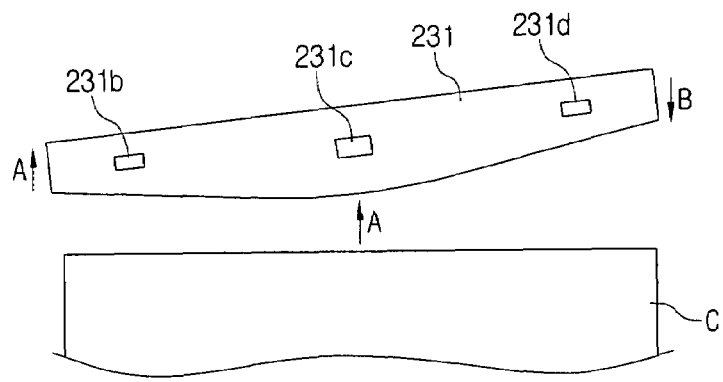
FIGS. 9A, 9B and 9C are side elevational views illustrating operation of a link member when a card is inserted in a card slot apparatus according to an exemplary embodiment of the present invention.
Figure 9B:
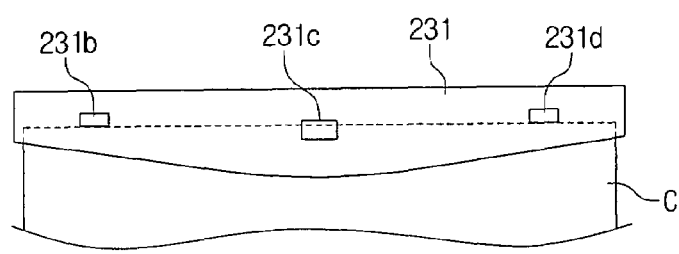

As illustrated in FIGS. 9A and 9B, the link member 231 is supported by the upper cover 213, so that when the card C is inserted the preceding end of the card C first contacts the first contact protrusion 231b.

As illustrated in FIG. 9A, with the construction as described above, when the first contact protrusion 231b is rotated in the direction of arrow A, that is, the inserting direction of the card C, by the inserting operation of the card C, the other end of the link member 231 on which the hook 231a is formed is rotated in the opposite direction B to the inserting direction A of the card C. Thus, as illustrated in FIG. 9B, the second contact protrusion 231d along with the first contact protrusion 231b supports the preceding end of the card C inserted into the slot body 210.

The lever member 232 is coupled to the link member 231 to linearly move according to the rotation of the link member 231. The link member 232 includes a first lever 233 coupled to the link member 231, and a second lever 234 coupled to the first lever 233.

First and second guide slits 233c and 234b are formed respectively in the first and the second levers 233 and 234 to correspond to each other. A slider 237 is inserted in the first and second guide slits 233c and 234b to movably couple the first and the second levers 233 and 234 with each other. The first lever 233 has a hanging protrusion 233b that engages a jaw portion 234c of the second lever 234.

A hook groove 233a, on which the hook 231a of the link member 231 is hooked, is formed in the first lever 233. Accordingly, during the insertion operation of the card C, when the link member 231 is rotated into contact with the preceding end of the card C, the first lever 233 and the second lever 234 coupled to the first lever 233 are also moved. The moving direction of the hook 231a and the first and the second levers 233 and 234 is in the opposite direction B to the inserting direction A of the card C.

An operating part 234d is disposed on the second lever 234 to eject the card C inserted into the slot body 210 to the outside. The operating part 234d is configured such that it is projected by a predetermined length outside the slot body 210 when the heat sink 221 is moved to the second position. Accordingly, as the user presses the projected operating part 234d in the opposite direction B to the inserting direction A of the card C, a pressing force is transmitted to second lever 234, the first lever 233 and the link member 231 to push the inserted card C in the direction of arrow B.

The first and second cams 235 and 236 guide the heat radiating unit 220 when it is moved between the first position and the second position. The first and second cams 235 and 236 are formed in the second lever 234 to operate in combination with the lever member 232.

Figure 6:
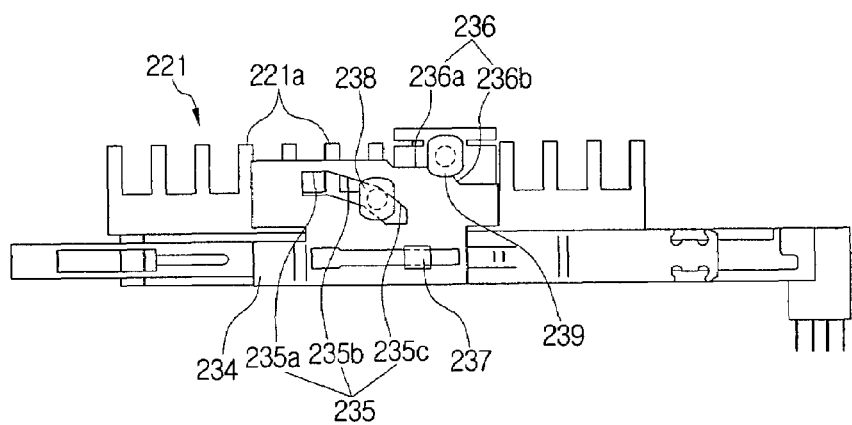
FIG. 6 is a left side elevational view of the card slot apparatus of FIG. 4.

The first cam 235 is formed in the shape of a closed curve in a cam hole 234a penetrated in an upper part of the second lever 234. The first cam 235 is provided with a flat surface 235a, a gentle slope surface 235b and a steep slope surface 235c, which are connected with one another, as shown in FIG. 6.

The gentle slope surface 235b and the steep slope surface 235c are inclined in a direction, that is, a downward direction, such that when moved by the card C during the inserting operation of the card C the lever member 232 moves the heat radiating unit 220 to the second position. The steep slope surface 235c corresponds to the second position of the heat radiating unit 220.

The second cam 236 is formed in the shape of an opened curve on a top surface of an end of the second lever 234. The second cam 236 is provided with a flat surface 236a and a steep slope surface 236b, which are connected with each other, as shown in FIG. 6. The flat surface 236a is formed above the steep slope surface 236b. The steep slope surface 236b is inclined in the same direction as that of the gentle slope surface 235b and the steep slope surface 235c of the first cam 235, and corresponds to the second position of the heat radiating unit 220.

The first guide 238 is coupled to the heat radiating unit 220 through the first cam 235. As illustrated in FIG. 5, the first guide 238 is inserted in the first fixing hole 222a and the cam hole 234a forming the first cam 235, and is fixed to the heat sink 221.

Accordingly, when the first guide 238 is guided along the first cam 235 by the movement of the second lever 234, the elastic member 222 and the heat sink 221 fixed to the elastic member 222 are moved together.

The second guide 239 is coupled to the elastic unit 240 through the second cam 236. An operation of the second guide 239 with the elastic unit 240 is described later.

The elastic unit 240 elastically urges the moving unit 230 in a moving direction thereof, and includes a moving member 241, a fixing member 242, and a tension coil spring 243.

The moving member 241 has a second fixing hole 241a into which the second guide 239 is inserted, so that it is coupled with the second guide 239. The second guide 239 inserted in the second fixing hole 241a is fastened by a nut 239a. Thus, the second guide 239 is rollably coupled to the moving member 241, and is guided along the second cam 236.

The fixing member 242 is fixed to the slot body 210, and has a guide bar 242a to guide the movement of the moving member 241.

The tension coil spring 243 is disposed between the moving member 241 and the fixing member 242. An elastic force of the tension coil spring 243 is varied by the second guide 239 guided along the second cam 236, and a gap between the moving member 241 and the fixing member 242 is adjusted accordingly.

When the second guide 239 is guided along the steep slope surface 236a of the second cam 236 in combination with the insertion movement of the card C, the moving member 241 coupled to the second guide 239 is also guided downwardly by the guide bar 242a. Thus, the tension coil spring 243 is compressed.

The tension coil spring 243 has a downward elastic force generated by the compression, and an elastic force is exerted in a moving direction of the lever member 232 due to a component force generating from the steep slope surface 236b of the second cam 236.

Such an elastic force of the tension coil spring 243 exerted in the moving direction of the lever member 232 compensates for movement resistance of the lever member 232 due to an elastic force of the elastic member 222, which is coupled to the first guide 238 guided along the steep slope surface 235c of the first cam 235.

Hereinafter, an operation of the card slot apparatus 200 of the electronic machine 100 constructed as described above is described in detail with reference to FIGS. 3 through 9C.

Figure 8A:
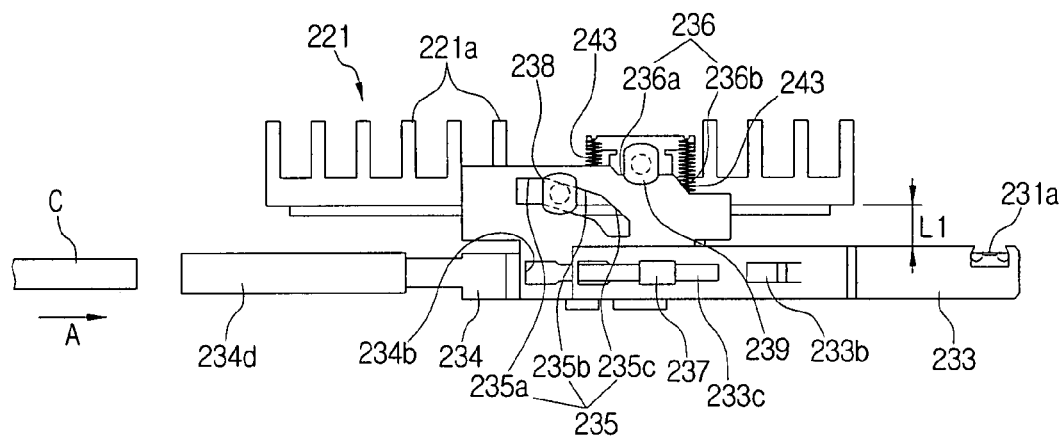
FIGS. 8A and 8B are side elevational views illustrating operation of the card slot apparatus according to an exemplary embodiment of the present invention.

FIG. 8A illustrates the card slot apparatus 200 (FIG. 3) when the card C is not inserted in the slot body 210. As shown in FIGS. 3 and 8A, the heat radiating unit 220 is spaced apart from the lever member 232 of the slot body 210 with a predetermined gap L1. The first guide 238 is positioned on the gentle slope surface 235b of the first cam 235, and the second guide 239 is positioned on the flat surface 236a of the second cam 236.

As illustrated in FIGS. 3 and 9A, when the card C is inserted in a direction of arrow A, the card is moved along the guide rail 212 of the slot body 210 so that a preceding end of the card C pushes the first contact protrusion 231b of the link member 231 in the direction of arrow A. Thus, as illustrated in FIG. 9B, the link member 231 is rotated about the rotation axle 231c, so that one end thereof on which the first contact protrusion 231b is formed is moved in the direction of arrow A and the other end thereof on which the hook 231a is formed moved in a direction of arrow B.

With such a rotation of the link member 231, the first lever 233 is also moved in the direction of arrow B. The second lever 234 is moved along with the first lever 233 by the slider 237 inserted in the first and second guide slits 233c and 234b and the hanging protrusion 233b that presses the jaw portion 234c of the second lever 234. Thus, the first and the second levers 233 and 234 are moved by a predetermined length L2, so that the operating part 234d of the second lever 234 is projected by the predetermined length L2 to the outside.

Figure 8B:
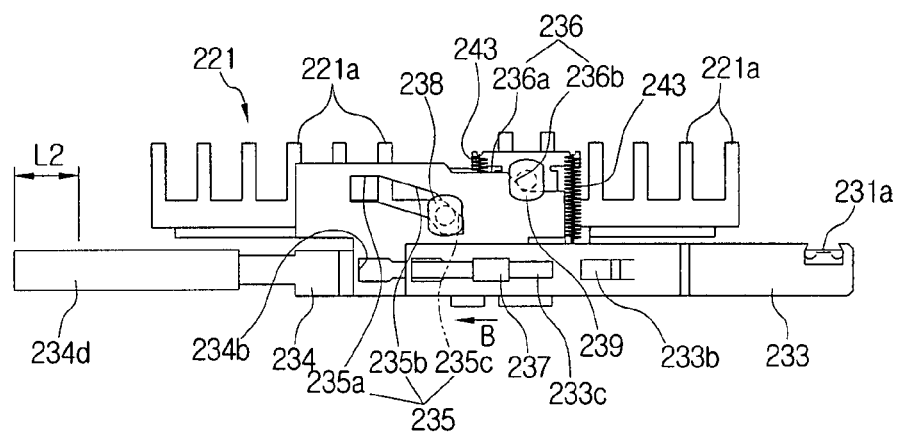

As illustrated in FIG. 8B, with such a movement of the first and the second levers 233 and 234 in the direction of arrow B, the first guide 238 is moved from the gentle slope surface 235b to the steep slope surface 235c of the first cam 235, and the second guide 239 is moved from the flat slope surface 236a to the steep slope surface 236b of the first cam 236.

As illustrated in FIG. 7, the heat radiating unit 220 is moved to the second position by the first guide 238 positioned on the steep slope surface 235c of the first cam 235, so that the elastic member 222 presses the heat sink 221.

When the first guide 238 is guided along the steep slope surface 235c of the first cam 235, the heat radiating unit 220 is lowered faster than when the first guide 238 is guided along the gentle slope surface 235b at an early inserting stage of the card C, due to the difference of the inclined angles.

When the first guide 238 is guided by the steep slope surface 235c of the first cam 235, the card C is connected with the connecting pins 211a of the housing 211, and the insertion operation of the card C is completed. That is, with the completion of the insertion operation of the card C, the heat radiating unit 220 moves downwardly and contacts the card C.

When the first guide 238 is guided along the steep slope surface 235c of the first cam 235 such that the heat radiating unit 220 is rapidly lowered, an elastic pressing force of the elastic member 222 in the downward direction is also rapidly increased. Accordingly, the first guide 238 is not guided to an end of the steep slope surface 235c, but stopped at a certain point of the steep slope surface 235c. Thus, the heat sink 221 does not completely come in close contact with the card C.

This is compensated by an elastic force of the tension coil spring 243 exerted in the moving direction of the lever member 232, which is generated at the steep slope surface 236b.

When the first guide 238 is positioned on the steep slope surface 235c of the first cam 235, the second guide 239 is positioned on the steep slope surface 236b of the second cam 236, so that the tension coil spring 243 exerts an elastic force in the moving direction, that is, the direction of arrow B, of the lever member 232. Thus, the first guide 238, which is stopped at the certain point of the steep slope surface 235c of the first cam 235, may be guided to the end of the steep slope surface 235c of the first cam 235. Accordingly, the heat sink 221 completely comes in close contact with the card C and radiates heat generated when the card C is operated.

When the card C is to be ejected from the slot body 210, the operating part 234d, which was moved by the predetermined length L2 to the outside, is pressed in the direction of arrow A. Then, the second lever 234 on which the operating part 234d is installed is moved in the direction of arrow A along with the first lever 233 coupled to the second lever 234.

Figure 9C:
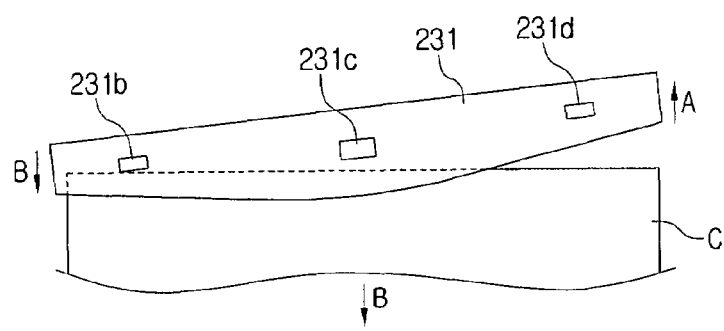

With the movement of the first lever 233 in the direction of arrow A, the hook 231a of the link member 231 fixed to the hook groove 233a is also moved in the direction of arrow A, as illustrated in FIG. 9C. Thus, the first protrusion 231b of the link member 231 pushes the preceding end of the card C in the direction of arrow B to eject the card C to the outside. The first and the second guides 238 and 239 are guided along the first and the second cams 235 and 236 to again move the heat radiating unit 220 to the first position.

As is apparent from the foregoing description, according to exemplary embodiments of the present invention, the card slot apparatus and the electronic machine having the same are configured so that the elastic unit elastically urges the moving unit in the moving direction thereof, thereby compensating the movement resistance generated by the abrupt elastic force of the elastic member at the point of time when the insertion operation of the card is completed. Accordingly, the card may be inserted in the slot body with a small force, and at the same time, the contact force between the heat radiating unit and the card may be improved, thereby increasing the heat radiating efficiency.

Also, according to exemplary embodiments of the present invention, the card slot apparatus and the electronic machine having the same are configured so that the moving unit brings the heat radiating unit in contact with the card after the insertion operation of the card is completed. Accordingly, the conventional problems, such as friction created between the insertion of the card and the lowering of the heat radiating unit, may be substantially prevented.

Although representative embodiments of the present invention have been shown and described to exemplify the principle of the present invention, the present invention is not limited to these specific embodiments. It will be understood that various modifications and changes may be made by one skilled in the art without departing from the spirit and scope of the invention as defined by the appended claims. Therefore, it shall be considered that such modifications, changes and equivalents thereof are all included within the scope of the present invention.

What is claimed is:

1. A card slot apparatus, comprising:
   a slot body having a slot in which a card is inserted;
   a heat radiating unit movable between a first position spaced apart from the card, and a second position contacting the card;
   a moving unit for moving the heat radiating unit to the second position while moving in a direction opposite to an insertion direction of the card substantially concurrently with an insertion operation of the card into the slot body, the moving unit further comprising
      a link member for rotating forwardly and backward for contacting a preceding end of the card inserted in the slot body;
      a lever member coupled to the link member to linearly move according to a rotation of the link member, and having a first cam and a second cam;
      a first guide coupled to the heat radiating unit through the first cam; and
      a second guide coupled to the elastic unit through the second cam; and
   an elastic unit for elastically urging the moving unit in a moving direction thereof.

2. The apparatus as claimed in claim 1, wherein the first cam is formed in the shape of a closed curve, and comprises a flat surface, a gentle slope surface and a steep slope surface.

3. The apparatus as claimed in claim 1, wherein the second cam is formed in the shape of an opened curve, and comprises a flat surface and a steep slope surface.

4. The apparatus as claimed in claim 1, wherein the lever member comprises
   a first lever is coupled to the link member; and
   a second lever is coupled to the first lever, the first and the second cams being formed on the second lever.

5. The apparatus as claimed in claim 4, wherein the lever member further comprises
   first and second guide slits formed respectively in the first and the second levers to correspond to each other; and
   a slider is inserted in the first and the second guide slits for movably coupling the first and the second levers with each other.

6. The apparatus as claimed in claim 5, wherein the first lever has a hanging protrusion that engages a jaw portion of the second lever.

7. The apparatus as claimed in claim 6, wherein the second lever has an operating part adapted to eject the card.

8. The apparatus as claimed in claim 1, wherein the elastic unit comprises:
   a moving member to which the second guide is coupled;
   a fixing member fixed to the slot body, and having a guide bar for guiding movement of the moving member; and
   a tension coil spring disposed between the moving member and the fixing member.

9. The apparatus as claimed in claim 8, wherein the second guide is rollably coupled to moving member.

10. The apparatus as claimed in claim 1, wherein
    the heat radiating unit comprises a heat sink, and an elastic member to press the heat sink when the heat sink is moved to the second position; and
    the first guide is coupled to the elastic member.

11. The apparatus as claimed in claim 10, wherein the elastic member comprises a leaf spring, and an approximate center of the leaf spring is coupled to the heat sink.

12. An electronic machine, comprising:
    a main body; and
    a card slot apparatus disposed in the main body for mounting a dismountable card;
    wherein the card slot apparatus comprises:
       a slot body having a slot in which the card is inserted;
          a heat radiating unit movable between a first position spaced apart from the card, and a second position contacting the card;
          a moving unit for moving the heat radiating unit to the second position while moving in an opposite direction to an insertion direction of the card substantially concurrently with an insertion operation of the card into the slot body, wherein the moving unit further comprises
             a link member for rotating forwardly and backwardly for contacting a preceding end of the card inserted in the slot body;
             a lever member coupled to the link member for linearly moving according to a rotation of the link member, and having a first cam and a second cam;
             a first guide coupled to the heat radiating unit through the first cam; and
             a second guide coupled to the elastic unit through the second cam; and
          an elastic unit for elastically urging the moving unit in a moving direction thereof.

13. The machine as claimed in claim 12, wherein the first cam is formed in the shape of a closed curve, and comprises a flat surface, a gentle slope surface and a steep slope surface.

14. The machine as claimed in claim 12, wherein the second cam is formed in the shape of an opened curve, and comprises a flat surface and a steep slope surface.

15. The machine as claimed in claim 12, wherein the lever member comprises
    a first lever coupled to the link member;
    a second lever coupled to the first lever; and
    the first and the second cams being formed on the second lever.

16. The machine as claimed in claim 15, wherein the lever member further comprises
    first and second guide slits formed respectively in the first and the second levers to correspond to each other; and
    a slider inserted in the first and the second guide slits for movably coupling the first and the second levers with each other.

17. The machine as claimed in claim 16, wherein the first lever has a hanging protrusion that engages a jaw portion of the second lever.

18. The machine as claimed in claim 17, wherein the second lever has an operating part for ejecting the inserted card.

19. The machine as claimed in claim 12, wherein the elastic unit comprises:
a moving member to which the second guide is coupled;
a fixing member fixed to the slot body, and having a guide bar for guiding movement of the moving member; and
a tension coil spring disposed between the moving member and the fixing member.

20. The machine as claimed in claim 19, wherein the second guide is rollably coupled to the moving member.

21. The machine as claimed in claim 12, wherein
the heat radiating unit comprises a heat sink;
an elastic member presses the heat sink when the heat sink is moved to the second position; and
the first guide is coupled to the elastic member.

22. The machine as claimed in claim 21, wherein the elastic member comprises a leaf spring, and an approximate center of the leaf spring is coupled to the heat sink.

23. A card slot apparatus, comprising:
a slot body having a slot in which a card is insertable and removable;
a heat radiating unit movable between a first position spaced from the card and a second position contacting the card;
a moving unit for moving the heat radiating unit between first and second positions, such movement being in a direction opposite to a direction in which the card is concurrently moving, the moving unit including
a link member for rotating forwardly and backwardly for contacting a preceding end of the card inserted in the slot body;
a lever member coupled to the link member for moving linearly in response to a rotation of the link member, and having a first cam and a second cam;
a first guide coupled to the heat radiating unit through the first cam; and
a second guide coupled to the elastic unit through the second cam; and
an elastic unit for elastically urging the moving unit toward the second position.

24. The apparatus as claimed in claim 23, wherein the first cam is formed in the shape of a closed curve, and comprises a flat surface, a gentle slope surface and a steep slope surface.

25. The apparatus as claimed in claim 23, wherein the second cam is formed in the shape of an opened curve, and comprises a flat surface and a steep slope surface.

26. The apparatus as claimed in claim 23, wherein the lever member includes
a first lever is coupled to the link member; and
a second lever is coupled to the first lever, the first and the second cams being formed on the second lever.

27. The apparatus as claimed in claim 26, wherein the lever member further comprises
first and second guide slits formed respectively in the first and the second levers to correspond to each other; and
a slider is inserted in the first and the second guide slits for movably coupling the first and the second levers with each other.

28. The apparatus as claimed in claim 27, wherein the first lever has a hanging protrusion that engages a jaw portion of the second lever.

29. The apparatus as claimed in claim 28, wherein the second lever has an operating part adapted to eject the card.

30. The apparatus as claimed in claim 23, wherein the elastic unit includes
a moving member to which the second guide is coupled;
a fixing member fixed to the slot body, and having a guide bar for guiding movement of the moving member; and
a tension coil spring disposed between the moving member and the fixing member.

31. The apparatus as claimed in claim 30, wherein the second guide is rollably coupled to moving member.

32. The apparatus as claimed in claim 23, wherein
the heat radiating unit comprises a heat sink, and an elastic member to press the heat sink when the heat sink is moved to the second position; and
the first guide is coupled to the elastic member.

33. The apparatus as claimed in claim 32, wherein the elastic member comprises a leaf spring, and an approximate center of the leaf spring is coupled to the heat sink.

34. A card slot apparatus, comprising:
a slot body having a slot in which a card is inserted;
a heat radiating unit movable between a first position spaced apart from the card, and a second position contacting the card, the heat radiating unit comprising a heat sink and an elastic member to press the heat sink when the heat sink is moved to the second position;
a moving unit for moving the heat radiating unit to the second position while moving in a direction opposite to an insertion direction of the card substantially concurrently with an insertion operation of the card into the slot body; and
an elastic unit for elastically urging the moving unit in a moving direction thereof when the heat sink is moved to the second position.

35. An electronic machine, comprising:
a main body; and
a card slot apparatus disposed in the main body for mounting a dismountable card;
wherein the card slot apparatus comprises:
a slot body having a slot in which the card is inserted;
a heat radiating unit movable between a first position spaced apart from the card, and a second position contacting the card, the heat radiating unit further comprising a heat sink and an elastic member to press the heat sink when the heat sink is moved to the second position;
a moving unit for moving the heat radiating unit to the second position while moving in an opposite direction to an insertion direction of the card substantially concurrently with an insertion operation of the card into the slot body; and
an elastic unit for elastically urging the moving unit in a moving direction thereof when the heat sink is moved to the second position.

36. A card slot apparatus, comprising: a slot body having a slot in which a card is insertable and removable; a heat radiating unit movable between a first position spaced from the card and a second position contacting the card, the heat radiating unit including a heat sink and an elastic member to press the heat sink when the heat sink is moved to the second position; a moving unit for moving the heat radiating unit between first and second positions, such movement being in a direction opposite to a direction in which the card is concurrently moving; and an elastic unit for elastically urging the moving unit toward the second position;
wherein the elastic unit elastically urges the moving unit in the moving direction thereof when the heat sink is moved to the second position.

* * * * *